United States Patent [19]

Dash

[11] 3,901,737

[45] Aug. 26, 1975

[54] METHOD FOR FORMING A SEMICONDUCTOR STRUCTURE HAVING ISLANDS ISOLATED BY MOATS

[75] Inventor: Somanath Dash, Palo Alto, Calif.

[73] Assignee: Signetics Corporation, Sunnyvale, Calif.

[22] Filed: Feb. 15, 1974

[21] Appl. No.: 442,744

[52] U.S. Cl. .................................... 148/1.5; 357/91

[51] Int. Cl.$^2$ ............................................ H01L 7/54

[58] Field of Search ................ 148/1.5, 187; 357/91

[56] References Cited

UNITED STATES PATENTS

| | | | |
|---|---|---|---|
| 3,707,765 | 1/1973 | Coleman | 148/1.5 X |
| 3,793,088 | 2/1974 | Eckton, Jr. | 148/1.5 |
| 3,796,612 | 3/1974 | Allison | 148/187 X |

*Primary Examiner*—C. Lovell
*Assistant Examiner*—J. M. Davis
*Attorney, Agent, or Firm*—Flehr, Hohbach, Test, Albritton & Herbert

[57] ABSTRACT

Isolated islands are formed in a semiconductor structure by moats which are formed either as an isotropically etched U-shaped moat or a anisotropically etched trapezoidal moat. The ion implantation to form P+ isolation regions occurs only through the bottom of the moat because of the thicker inclined side walls which act as an effective mask.

3 Claims, 9 Drawing Figures

METHOD FOR FORMING A SEMICONDUCTOR STRUCTURE HAVING ISLANDS ISOLATED BY MOATS

BACKGROUND OF THE INVENTION

The present invention is directed to a method for forming a semiconductor structure having islands isolated by adjacent moats.

As disclosed in patent application Ser. No. 169,294, filed Aug. 5, 1971, entitled "Semiconductor Isolation Method Utilizing an Isotropic Etching and Differential Thermo-Oxidiation" and now U.S. Pat. No. 3,796,612 and in a corresponding continuation-in-part application filed Nov. 12, 1973, Ser. No. 414,764 entitled "Semiconductor Structure and Method" both in the name of David F. Allison, where isolation between semiconductor devices either of the NPN bipolar transistor type or MOS is desired, these devices are isolated by islands which are separated from one another by a combination of dielectric isolation in the form of moats and regions of higher conductivity extending downwardly into the underlying semiconductor substrate from the moats. As disclosed and claimed in both the Allison patent and continuation-in-part application, the moats in general have inclined side walls normally inclined along a predetermined crystal plane orientation and a bottom wall which is parallel to the top surface of the semiconductor body. A region of higher conductivity extending downwardly into the semiconductor body for the moats is provided either by diffusion or ion implantation techniques.

The foregoing technique improves the density of the final integrated circuit as opposed to the more normal diffusion type isolation. In addition, the region of higher conductivity prevents field effect transistor action which has a tendency to circumvent the isolation of the moats or grooves.

OBJECTS AND SUMMARY OF THE INVENTION

It is a general object of the present invention to provide an improved method of forming a semiconductor structure having islands isolated by adjacent moats.

In accordance with the above object there is provided a method for forming a semiconductor structure which includes a silicon semiconductor substrate of one conductivity type having a surface. A silicon semiconductor material of an opposite conductivity type is epitaxially deposited on the surface and has a top surface. An etch resistant mask is formed on the top surface with a plurality of windows. Moats extending downwardly having inclined walls and a substantially flat bottom are formed by the use of an etch and mask. The moats are oxidized to form an oxide wall. An impurity of one conductivity type is caused by ion implantation to enter the substrate through the bottom of the moats. The energy of the ion implant is adjusted so as not to penetrate the effectively thicker inclined side walls to form isolation regions having an impurity concentration greater than that of the substrate.

DETAILED DESCRIPTION OF THE PREFERRED EMBODIMENTS

Figure 1:
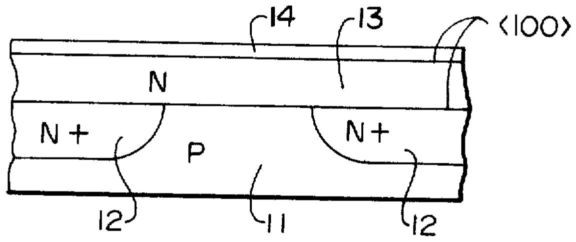
FIGS. 1 through 5 are cross sectional views showing the steps in the process according to one embodiment of the invention.
Figure 2:
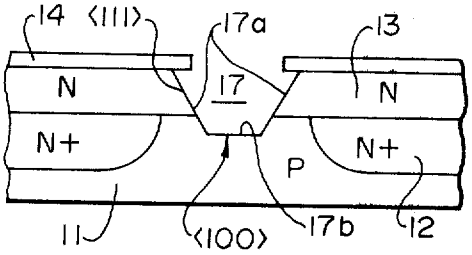
Figure 3:
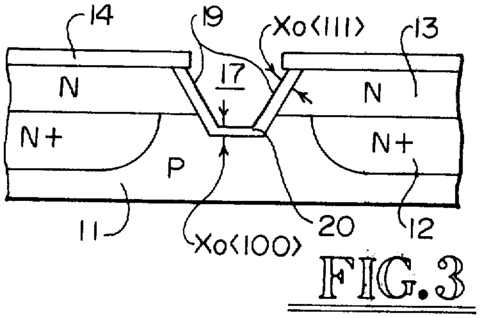

As disclosed in FIGS. 1, 2 and 3 and also taught by the above Allison patent and continuation-in-part application, flat bottom isolation groves 17 are provided which may be characterized as having a trapezoidal shape. Specifically, the grooves have inclined side walls 17*a* which are oriented in the $\langle 111 \rangle$ crystal plane and a bottom wall 17*b* which is oriented in the $\langle 100 \rangle$ plane as illustrated. The semiconductor structure also includes the P-type substrate 11 with buried N+ collectors 12 and N-type epitaxially grown layer 13 with a passivating or etch resistant layer 14. Groove 17 is provided by an anisotropic etch to depths such that the groove is slightly deeper than the thickness of the epitaxial layer 13. As is taught by the above Allison application and patent the oxide layer or wall 19 at the side walls is grown at a relatively low temperature such that its thickness $X_o \langle 111 \rangle$ is greater than the oxide layer or wall 20 thickness $X_o \langle 100 \rangle$ at the bottom of the groove. The passivating layer 14 is, of course, undercut by the nature of the anisotropic etching.

Figure 4:
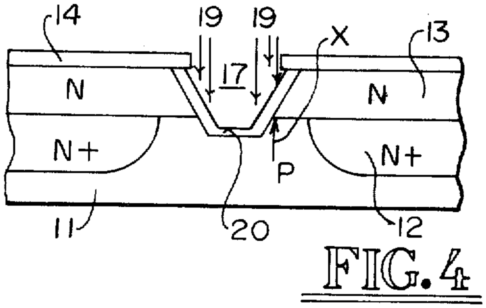
Figure 5:
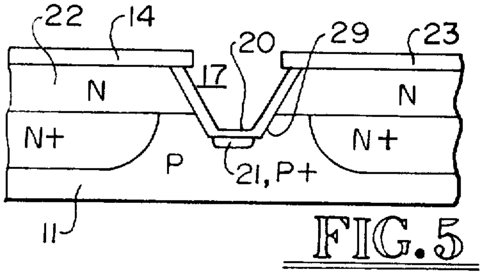
Figure 6A:
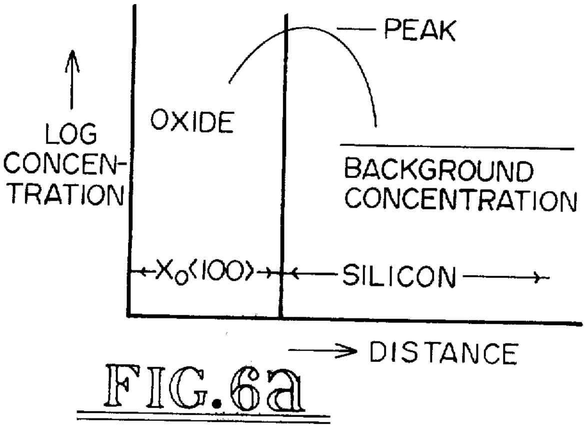
FIGS. 6A and 6B are curves useful in understanding the method of FIGS. 1 through 5.
Figure 6B:
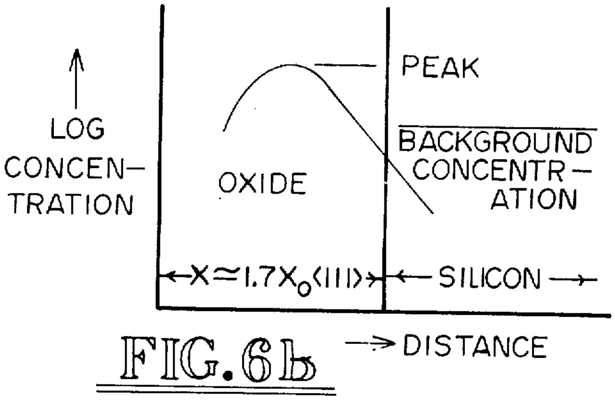

In accordance with the present invention as opposed to the above Allison patent and application, a P+ type isolation region is formed as illustrated in FIG. 4 by ion implantation of a P-type impurity through the bottom layer 20 of the moat 17. The energy of the ion implant is adjusted so as not to penetrate the effectively thicker inclined oxide layers 19 but to penetrate the relatively thinner bottom oxide layer 20. This forms, as illustrated in FIG. 5, a region 21 having an impurity concentration greater than that of the substrate 11. Such selective ion implantation occurs since the ion beam in essence sees a side wall oxide thickness, X, which is proportional to $1.7\ X_o \langle 111 \rangle$. In other words, the side wall thickness, since it is inclined is effectively greater than the bottom wall thickness. As FIG. 6A shows the peak of the concentration of ions lies inside the silicon below the bottom layer 20 of oxide to thus provide a high concentration at the region 21 as indicated in FIG. 5. However, as illustrated in FIG. 6B with relation to the side wall, the greater thickness of the side wall causes the peak of the concentration profile to occur in the oxide. Effectively, no doping of the P-type occurs in the N epitaxial layer.

Thereafter, as illustrated by the above Allison patent and application, active devices can be formed, for example, in the isolated island 22 and 23 in a manner well known in the art.

In order to provide even greater isolation, the moat 17 is filled with polycrystalline silicon and then by an oxidation process, a relatively thick oxide may be grown on the polycrystalline silicon. However, when this oxidation process is utilized, the P+ region 21 will, of course, tend to creep up on the side walls near the areas 29 (FIG. 5). With the present process, such creep is minimized since the P+ region has been initially limited by the above ion implantation method to only under the bottom layer 20.

Figure 7:
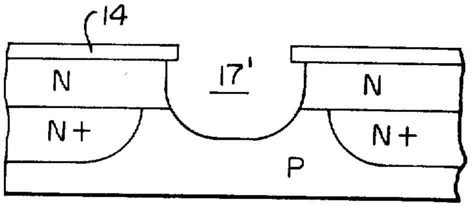
FIGS. 7 and 8 illustrate another embodiment of the invention.
Figure 8:
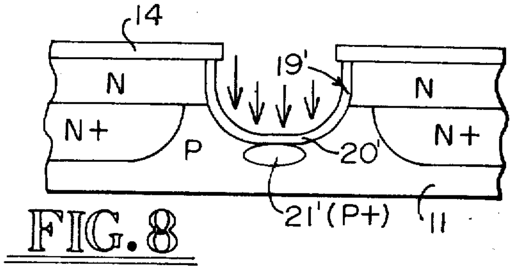

With respect to the above method, the effect of the increase in effective thickness of the inclined side wall by itself may be sufficient without the differential thickness brought by the low temperature oxidation to provide for the shift in curves illustrated in FIGS. 6A and 6B. This is illustrated in the embodiment of FIGS. 7 and 8 where instead of an anisotropic etch a U-shaped moat 17′ is formed by isotropic etch techniques well known in the art. Thereafter, the U-shaped moat is oxidized to provide a uniform oxide thickness 19′ all around the moat. Ion doping is conducted through bottom 20′ of the oxide layer to form the P+ region 21′. The effectively thicker side wall oxide layer will completely mask the beam and give an ion implant concentration profile similar to the one which occurs in the foregoing embodiment. In this embodiment no specific crystal plane orientations are necessary. For example, the U-shaped moat can be etched on <111>, <100>, <110> or any other crystal plane and still be isolated by ion implantation.

Thus, the present invention has provided an improved method for providing isolated islands in a semiconductor structure having moats to form islands.

I claim:

1. A method for forming a semiconductor structure comprising the following steps: providing a silicon semiconductor substrate of one conductivity type and having a surface; epitaxially depositing on said surface a layer of silicon semiconductor material of an opposite conductivity type and having a top surface; forming an etch resistant mask on said top surface with a plurality of windows; forming by the use of an etch and the mask a plurality of moats extending downwardly from said top surface to said substrate said moats having walls at least portions of which are inclined and a substantially flat bottom; oxidizing said moats to form an oxide wall; and causing by ion implantation an impurity of said one conductivity type to enter said substrate through the bottom of said moats the energy of the ion implant being adjusted so as not to penetrate the effective thicker inclined side walls to form isolation regions limited to the area under said bottom of said moat and having an impurity concentration greater than that of the substrate.

2. A method as in claim 1 where said etch is anisotropic and said moats are trapezoidally shaped.

3. A method as in claim 1 where said etch is isotropic and said moats are U-shaped.

* * * * *